US007313742B2

(12) United States Patent
Takahashi et al.

(10) Patent No.: US 7,313,742 B2
(45) Date of Patent: Dec. 25, 2007

(54) LOGIC CIRCUITRY HAVING SELF-TEST FUNCTION

(75) Inventors: Masafumi Takahashi, Kanagawa (JP); Kenji Ohmori, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 306 days.

(21) Appl. No.: 10/808,421

(22) Filed: Mar. 25, 2004

(65) Prior Publication Data

US 2005/0005211 A1   Jan. 6, 2005

(30) Foreign Application Priority Data

Mar. 26, 2003   (JP)   ............... 2003-084586

(51) Int. Cl.
*G01R 31/28*   (2006.01)

(52) U.S. Cl. ............... 714/724; 714/733; 714/734

(58) Field of Classification Search ............... None
See application file for complete search history.

(56) References Cited

U.S. PATENT DOCUMENTS

| | | | | |
|---|---|---|---|---|
| 3,623,020 A | * | 11/1971 | Mao ............... | 710/60 |
| 3,671,947 A | * | 6/1972 | Bossen et al. ............... | 714/782 |
| 3,872,245 A | * | 3/1975 | Sagawa et al. ............... | 358/471 |
| 4,151,510 A | * | 4/1979 | Howell et al. ............... | 714/758 |
| 4,188,665 A | * | 2/1980 | Nagel et al. ............... | 710/45 |
| 4,811,345 A | * | 3/1989 | Johnson ............... | 714/27 |
| 5,504,756 A | * | 4/1996 | Kim et al. ............... | 714/729 |
| 5,506,796 A | * | 4/1996 | Ishida ............... | 708/250 |
| 5,668,817 A | * | 9/1997 | Adham ............... | 714/732 |
| 6,105,154 A | * | 8/2000 | Wang et al. ............... | 714/732 |
| 6,728,901 B1 | * | 4/2004 | Rajski et al. ............... | 714/30 |
| 6,757,810 B1 | * | 6/2004 | Takahashi ............... | 712/200 |
| 6,877,119 B2 | * | 4/2005 | Lauga ............... | 714/726 |

FOREIGN PATENT DOCUMENTS

JP   6-250872   9/1994

* cited by examiner

*Primary Examiner*—Cynthia Britt
*Assistant Examiner*—Steven D Radosevich
(74) *Attorney, Agent, or Firm*—Oblon, Spivak, McClelland, Maier & Neustadt, P.C.

(57) ABSTRACT

A logic circuit having a self-test function includes a plurality of F/Fs having at least first-, second- and last-stage scanning F/Fs, each having a clock input, a scanning input and a scanning output terminals. The scanning F/Fs are connected one another so as to supply a scanning clock signal to the clock input terminal of each scanning F/F and a signal from the scanning output terminal of the first-stage to the scanning input terminal of the second-stage for sequential logical operations. Also provided in the logic circuit are a data selector to select either an external scanning signal or a signal output from the scanning output terminal of the last-stage and fed back through a feed-back signal line and a scanning controller to supply a control signal to the data selector so as to supply the signal fed back from the last-stage to the scanning input terminal of the first-stage, thus controlling each F/F in an internal scanning mode. The signal from the last-stage is supplied from the logic circuit via an external scanning output terminal.

6 Claims, 6 Drawing Sheets

LOGIC CIRCUITRY HAVING SELF-TEST FUNCTION

CROSS REFERENCE TO RELATED APPLICATIONS

This application claims benefit of priority under 35 USC § 119 to Japanese Patent Application No. 2003-084586 filed on Mar. 26, 2003, the entire contents of which are incorporated by reference.

BACKGROUND OF THE INVENTION

1. Field of the Invention:

The present invention relates to a logic circuit having a self-test function. Particularly, this invention relates to a logic circuit having a self-test function for checking conditions of a high-speed logic circuit such as a flip-flop in examination of malfunctions through test scanning, program debugging, etc.

2. Discussion of the Background:

Logic circuits such as processors require a dedicated built-in self-test circuit to perform test scanning for checking operational conditions or debug programs installed therein, for failure diagnosis. In other words, operational conditions of these circuits cannot be detected without the built-in self-test circuit.

Nevertheless, the logic circuits become bulk as a larger-scale built-in self-test circuit is used. In addition, the frequency of test output signals from the built-in self-test circuit have to be converted into a low frequency when the test output signals are sent out from the logic circuits.

Therefore, the built-in self-test circuit cannot offer accurate testing in terms of circuit scale and output-signal frequency.

Known logic circuits are equipped with scanning flip-flops (F/F), such as shown in FIG. 6, for test scanning. These F/F circuits are used in checking, for example, LSI (Large Scale Integrated Circuit) equipped with flip-flops, before shipment.

In FIG. 6, a test scanning circuit 20 is equipped with scanning F/F circuits 21, 22 and 23. Each F/F circuit has a clock input terminal SCK via which a scanning clock signal C1 sent via a common clock input terminal 24 is input.

The first-stage scanning F/F circuit 21 is further equipped with a scanning input terminal SIN for receiving a scanning input signal S1 sent via an external scanning-input terminal 25 and a scanning output terminal SOUT for supplying a scanning output signal to the second-stage scanning F/F circuit 22 after a specific logic operation based on the scanning input signal S1 and the scanning clock signal C1.

The second-stage scanning F/F circuit 22 is also equipped with a scanning input terminal SIN for receiving the scanning output signal from the scanning output terminal SOUT of the first-stage scanning F/F circuit 21 and a scanning output terminal SOUT for supplying a scanning output signal to the third-stage scanning F/F circuit 23 after a specific logic operation based on the scanning output signal from the first-stage scanning F/F circuit 21 and the scanning clock signal C1.

The third-stage scanning F/F circuit 23 is also equipped with a scanning input terminal SIN for receiving the scanning output signal from the scanning output terminal SOUT of the second-stage scanning F/F circuit 22 and a scanning output terminal SOUT for outputting a scanning output signal via an scanning output terminal 26 of the test scanning circuit 20.

In the test scanning circuit 20 configured as described above, the scanning input signal S1 supplied to the scanning input terminal SIN of the first-stage scanning F/F circuit 21 is further supplied to the scanning input terminal SIN of the third-stage scanning F/F circuit 23 via the second-stage scanning F/F circuit 22, and output from the scanning-output terminal SOUT of third-stage F/F circuit 23 to the scanning output terminal 26.

In other words, the known test scanning circuit 20 externally activates the internal F/F circuits with the scanning clock signal C1 and determines whether a test signal output from the scanning output terminal 26 is equal or close to an anticipated signal, thus diagnosing the internal F/F circuits.

Not only the three scanning F/F circuits shown in FIG. 6, the known test scanning circuit 20 may perform a scanning test with four or more scanning F/F circuits which may be divided into groups.

The known logic circuits require the built-in self-test circuit to perform test scanning for checking operational conditions or debug programs installed therein.

The scale of the built-in self-test circuit is, however, limited for saving the total circuit area. In addition, the known logic circuits require signal-frequency conversion for outputting the results of internal high-speed logic operations.

These are major factors causing difficulties in producing logic circuits with a dedicated built-in self-test circuit.

Scanning tests are performed before shipment for logic LSI products having scanning F/F circuits for detecting internal malfunctions.

The known built-in self-test circuit requires a test scanning signal externally input to the scanning F/F circuits for comparison with an anticipated signal in detection of malfunctions, thus cannot be used for program debugging.

SUMMARY OF THE INVENTION

A purpose of the present invention is to provide a logic circuit having a self-test function with a simple configuration for an F/F-scanning function for detection of circuit malfunctions and program debugging.

The present invention provides a logic circuit having a self-test function comprising: a plurality of scanning flip-flop (F/F) circuits having at least a first-stage scanning F/F circuit, a second-stage scanning F/F circuit and a last-stage scanning F/F circuit, each having a clock input terminal, a scanning input terminal and a scanning output terminal, the scanning F/F circuits being connected one another so that a scanning clock signal is input to the clock input terminal of each scanning F/F circuit and a signal output from the scanning output terminal of the first-stage scanning F/F circuit is supplied to the scanning input terminal of the second-stage scanning F/F circuit for sequential logical operations; a feed-back signal line through which a signal from the scanning output terminal of the last-stage scanning F/F circuit is fed back; at least one data selector to select either an external scanning signal or the signal fed back from the last-stage scanning F/F circuit, the selected signal being supplied to the scanning input terminal of the first-stage scanning F/F circuit; at least one scanning controller to supply a control signal to the data selector so that the signal fed back from the last-stage scanning F/F circuit is supplied to the scanning input terminal of the first-stage F/F scanning circuit, thus controlling each scanning F/F circuit in an internal scanning mode; and an external scanning output terminal via which the signal fed back from the last-stage scanning F/F circuit is output from the logic circuit.

DESCRIPTION OF PREFERRED EMBODIMENTS

Several embodiments of logic circuit having a self-test function according to the present invention will be disclosed with reference to the attached drawings.

Figure 1:
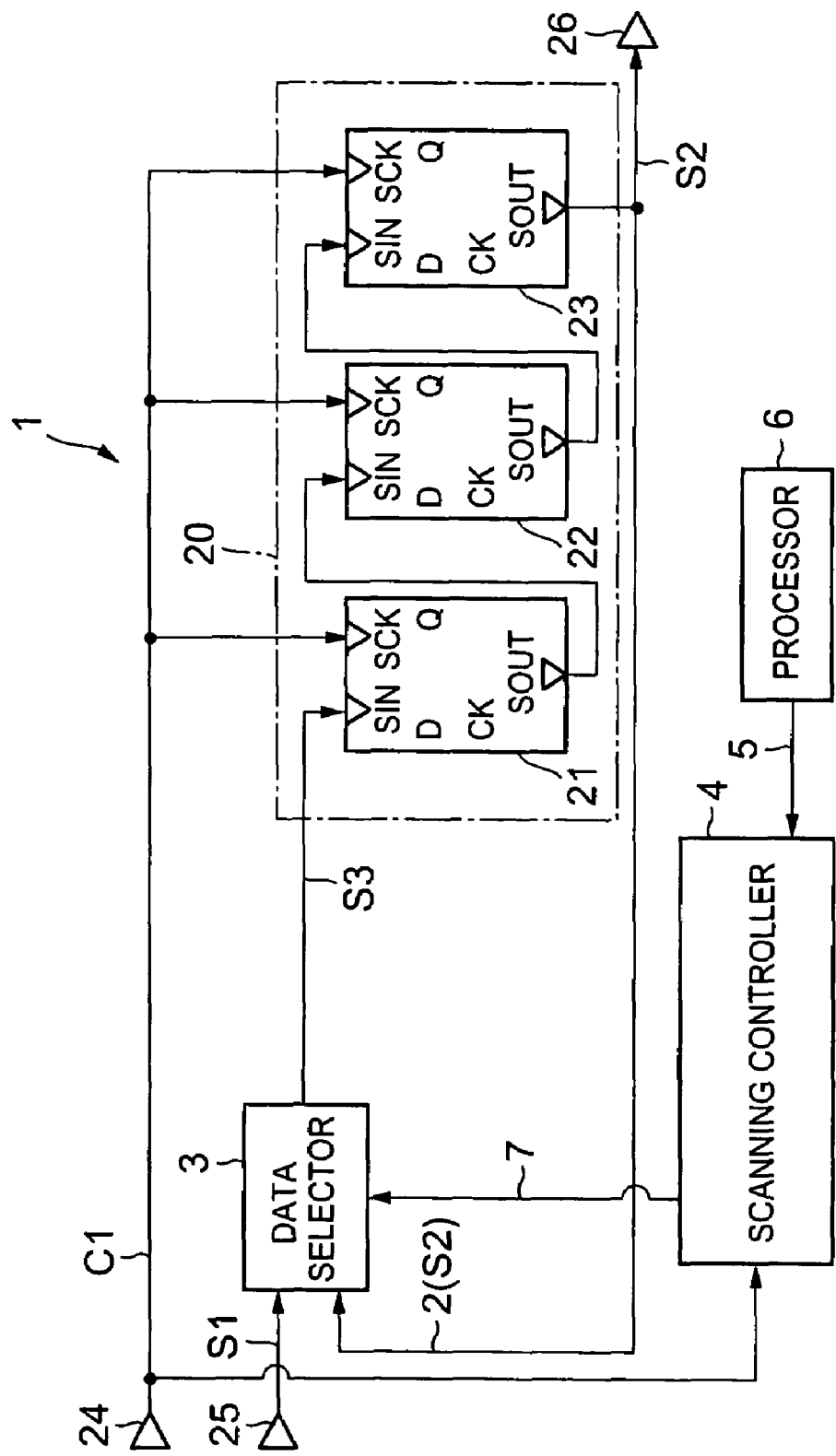
FIG. 1 shows a circuit diagram of a fundamental configuration of a logic circuit having a self-test function as a first embodiment according to the present invention.

Disclosed first with respect to FIG. 1 is a first embodiment of logic circuit, a fundamental configuration according to the present invention.

The first embodiment of logic circuit has the fundamental configuration for debugging processor instructions involved in a program, with a flip-flop (F/F)—scanning self-test function. Processor instructions are, for example, RISC (Reduced Instruction Set Computer) instructions.

A logic circuit 1 having a self-test function is fundamentally equipped with scanning F/F circuits 21, 22 and 23 connected to one another so that a scanning clock signal C1 is supplied to a clock input terminal SCK of each F/F circuit and an output signal from a scanning output terminal SOUT of an anterior F/F circuit, such as the F/F circuits 21, is supplied to a scanning input terminal SIN of a posterior F/F circuit, such as the F/F circuits 22, for logic operations; a common scanning clock terminal 24 via which the scanning clock signal C1 is externally supplied to the clock input terminal SCK of each F/F circuit; a feed-back signal line 2 through which a scanning output signal S2 of the last-stage F/F circuit 23 is fed back; a data selector 3 for selecting either an external scanning input signal S1 input via a scanning input terminal 25 or the scanning output signal S2 and supplying a selected signal S3 (signal S1 or S2) to the scanning input terminal SIN of the first-stage F/F circuit 21; a scanning controller 4 for supplying a data-selection control signal 7 to the data selector 3 so that the selector 3 selects the scanning output signal S2 and supplies the signal S2 (as the signal S3) to the scanning input terminal SIN of the first-stage F/F circuit 21, based on, for example, a processor instruction 5 involved in a program installed in a processor 6; and a scanning output terminal 26 via which the scanning output signal S2 is output from the logic circuit 1.

In operation, the scanning clock signal C1 is supplied to the scanning F/F circuits 21 to 23 and also the scanning controller 4 via the scanning clock terminal 24.

Program debugging with F/F scanning based on the processor instruction 5 begins with supply of the data-selection control signal 7 to the data selector 3 to select the scanning output signal S2 fed back from the last-stage F/F circuit 23, in response to the scanning clock signal C1 and the processor instruction 5.

Also supplied to the data selector 3 is the scanning input signal S1 via the scanning input terminal 25 for regular F/F scanning while the processor instruction 5 is not instructing the scanning controller 4 to perform program debugging.

Program debugging may be performed with an external instruction, in addition to the processor instruction 5. The scanning clock signal C1 may be generated within the logic circuit 1, in addition to external supply via the common scanning clock terminal 24.

Figure 2:
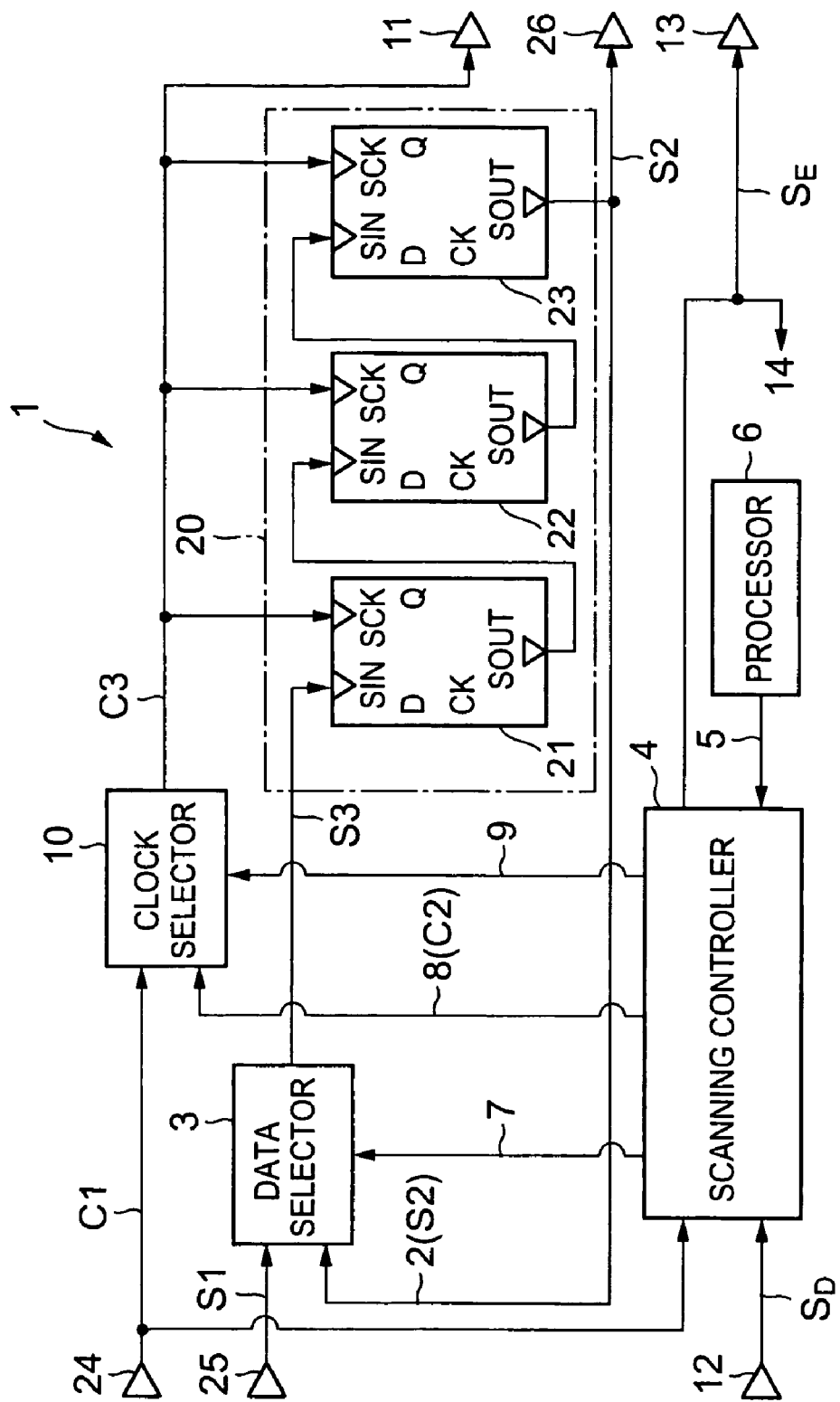
FIG. 2 shows a circuit diagram of a logic circuit as a second embodiment according to the present invention.

Disclosed next with reference to FIG. 2 is the second embodiment of logic circuit having a self-test function.

In addition to the circuit configuration the same as shown in FIG. 1, a logic circuit 1 shown in FIG. 2 is equipped with a clock selector 10 for selecting either an external scanning clock signal C1 supplied via a common scanning clock terminal 24 or an internal scanning clock signal C2 supplied from a scanning controller 4 through a signal line 8 and supplying a selected scanning clock signal C3 (C1 or C2) to scanning F/F circuits 21 to 23; and a scanning clock output terminal 11 via which the scanning clock signal C3 is output from the logic circuit 1.

The logic circuit 1 shown in FIG. 2 is further equipped with a disable-signal input terminal 12 via which a disable signal. $S_D$ is supplied to the scanning controller 4 to set an external F/F scanning mode for activating the scanning F/F circuits 21 to 23; and an enable output terminal 13 via which an enable signal $S_E$ indicating that the scanning F/F circuits 21 to 23 are sequentially operating is output from the logic circuit 1.

The scanning controller 4 outputs the enable signal $S_E$ via the enable output terminal 13 and further supplies the enable signal as an internal stall signal 14 to the scanning F/F circuits 21 to 23 to stop all clock signals supplied thereto.

In a scanning-clock supply mode, a scanning output signal S2 output from a scanning output terminal SOUT of the last-stage scanning F/F circuit 23 is fed back to the data selector 3 through the feed-back signal line 2, so that it is selected as a scanning signal S3. The signal S3 is then supplied to the scanning input terminal SIN of the first-stage scanning F/F circuit 21.

Supplying the scanning clock signal C3 having pulses, the number of which is equal to the number of the scanning F/F circuits 21 to 23, changes data in the F/F circuits before and after the clock supplying. The changed data are output from the logic circuit 1 via the scanning output terminal 26.

The scanning clock signal C3 supplied to the scanning F/F circuits 21 to 23 is either the external scanning clock signal C1 input to the clock selector 10 via the common clock input terminal 24 or the internal scanning clock signal C2 generated by the scanning controller 4 and input to the selector 10 through the signal line 8. The external scanning clock signal C1 or the internal scanning clock signal C2 is selected by the clock selector 10 under control by a clock-selection control signal 9 from the scanning controller 4.

The enable signal $S_E$ is output via the enable-signal output terminal 13 while the scanning F/F circuits 21 to 23 are sequentially operating, to indicate that these F/F circuits are in an operating mode. The enable signal $S_E$ is further supplied to the scanning F/F circuits 21 to 23 as the internal stall signal 14 to stop all clock signals to these F/F circuits so that data in these F/F circuits will not be changed.

The disable signal $S_D$ input via the input terminal 12 sets the logic circuit 1 (second embodiment) in the external F/F scanning mode for externally operating the scanning F/F circuits 21 to 23, like the known scanning F/F circuits.

In contrast, the internal scanning clock signal C2 selected as the scanning clock signal C3 sets the logic circuit 1 (second embodiment) in the internal F/F scanning mode for internally operating the scanning F/F circuits 21 to 23 under control by the clock-selection control signal 9 supplied to the clock selector 10 from the scanning controller 4 in response to the processor instruction 5.

The scanning operation based on the internal scanning clock signal C2 in the internal scanning mode debug a program for several cycles. The logic circuit 1 (second embodiment) is therefore employed as a debug circuit.

The disable signal $S_D$ supplied to the scanning controller 4 via the input terminal 12 allows the clock-selection control signal 9 to be supplied to the clock selector 10, thus the external scanning clock signal C1 being selected as the scanning clock signal C3 to set the logic circuit 1 (second embodiment) in the external F/F scanning mode.

The external scanning clock signal C1 is then supplied to the scanning F/F circuits 21 to 23 for external F/F scanning while the internal stall signal 14 (enable signal $S_E$) inhibits supply of the clock signal C2 to the F/F circuits 21 to 23.

Figure 6:
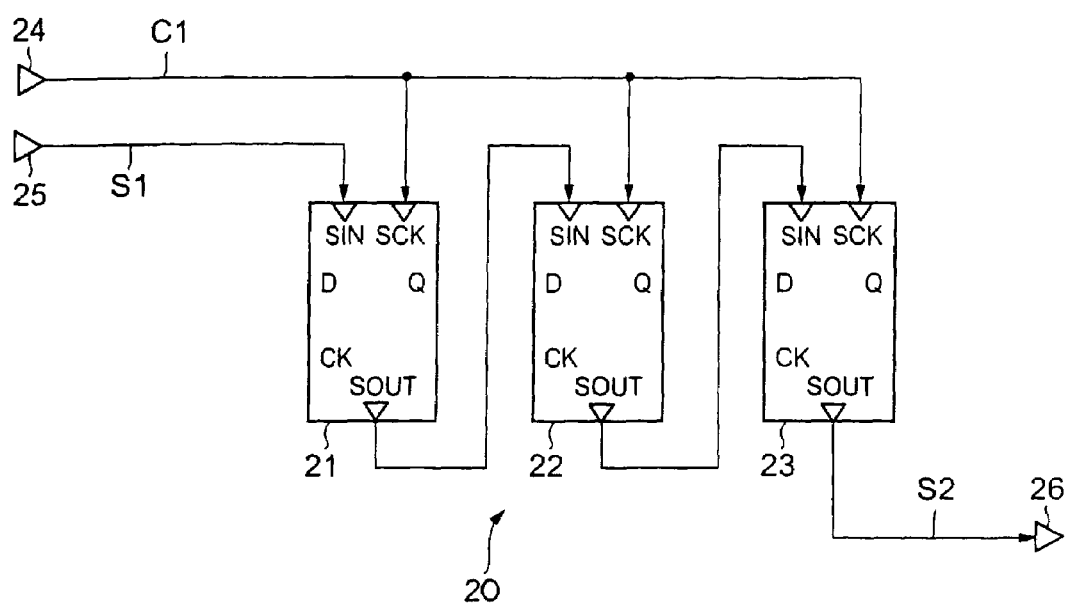
FIG. 6 shows a circuit diagram of scanning flip-flop circuits for a known logic circuit.

The logic circuit having a self-test function in the second embodiment is equipped with the data selector 3, the scanning controller 4 and the clock selector 10, in addition to the scanning F/F circuitry corresponding to the known circuitry shown in FIG. 6.

The logic circuit having a self-test function according to the present invention may, however, be configured in various forms.

For example, a serial-to-parallel converter may be provided at the output of the logic circuit 1 against a scanning signal output from the scanning output terminal 26 (FIG. 2) that is too fast as an external signal when the internal scanning clock signal C2 is selected even though such a fast signal causes no problems for the internal scanning operations.

Serial data output from the scanning output terminal 26 are converted into parallel data by the serial-to-parallel converter to cooperate with the internal high-speed processing.

Such a serial-to-parallel converter is further applicable to the logic circuit of the present invention when it is mounted on an LSI chip having extra external pins.

Figure 3:
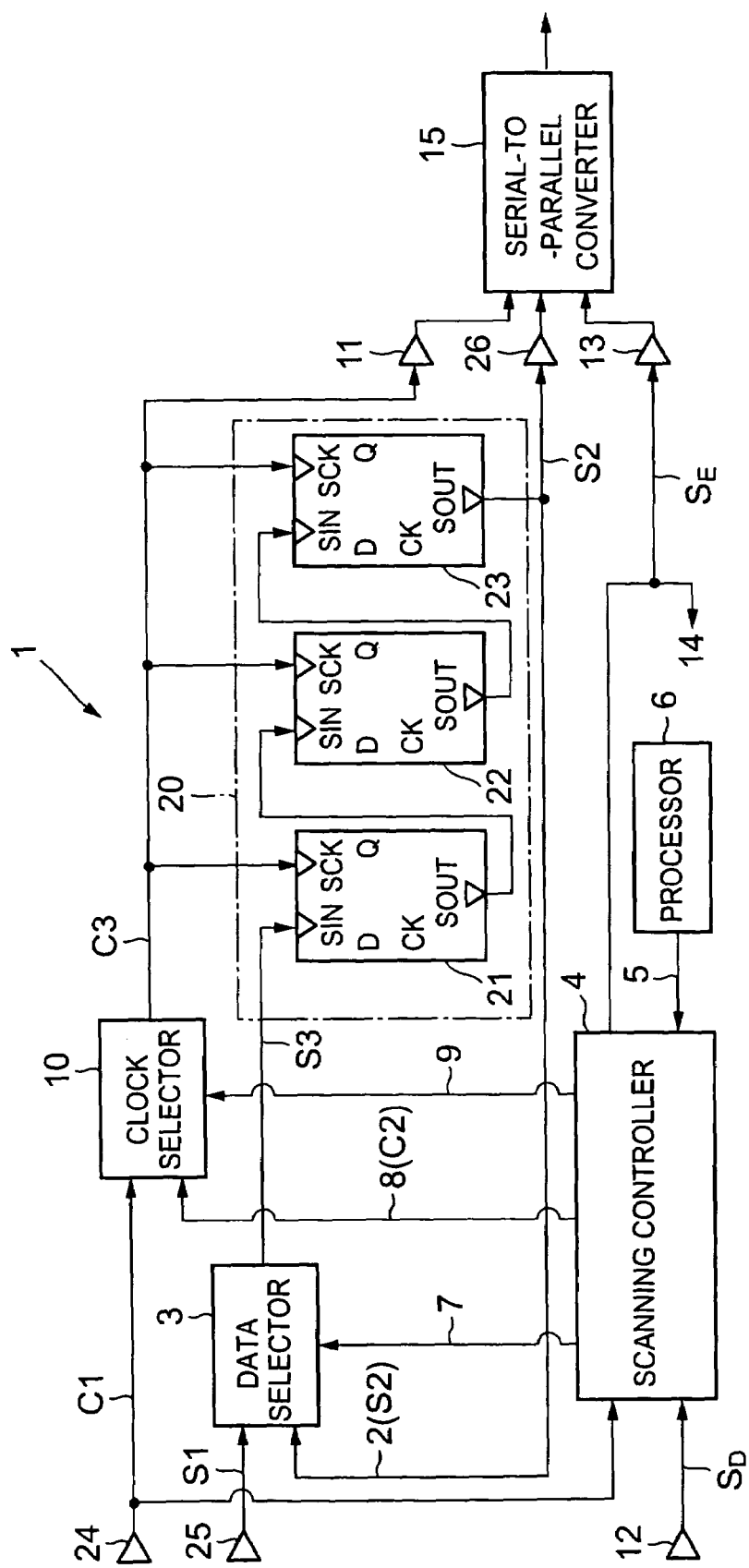
FIG. 3 shows a circuit diagram of a logic circuit as a third embodiment according to the present invention.

A feature of a logic circuit 1 as a third embodiment shown in FIG. 3 lies in a serial-to-parallel converter 15 connected at least to the scanning output terminal 26 of the scanning F/F circuitry.

In detail, the third embodiment of logic circuit according to the present invention is equipped with the serial-to-parallel converter 15 connected to the scanning output terminal 26, the clock output terminal 11 and the enable-signal output terminal 13. Serial data output from the scanning output terminal 26 are converted into parallel data by the serial-to-parallel converter 15 against the internal clock signal output from the clock output terminal 11 having a very high clock rate.

As disclosed, the logic circuit 1 (third embodiment) equipped with the serial-to-parallel converter 15 connected at least to the scanning output terminal 26 offers scanning outputs at a desired rate against the internal clocks at a very high rate by converting serial data of very fast scanning output signals into parallel data.

The logic circuit 1 (the second and third embodiments) disclosed so far internally generates the data-selection control signal 7 and the clock-selection control signal 9 with the scanning controller 4 in response to the processor instruction 5 for F/F-scanning operations.

Instead of the processor instruction 5, however, the logic circuit according to the present invention may be configured as externally triggering the internal clock signals at any moment.

Figure 4:
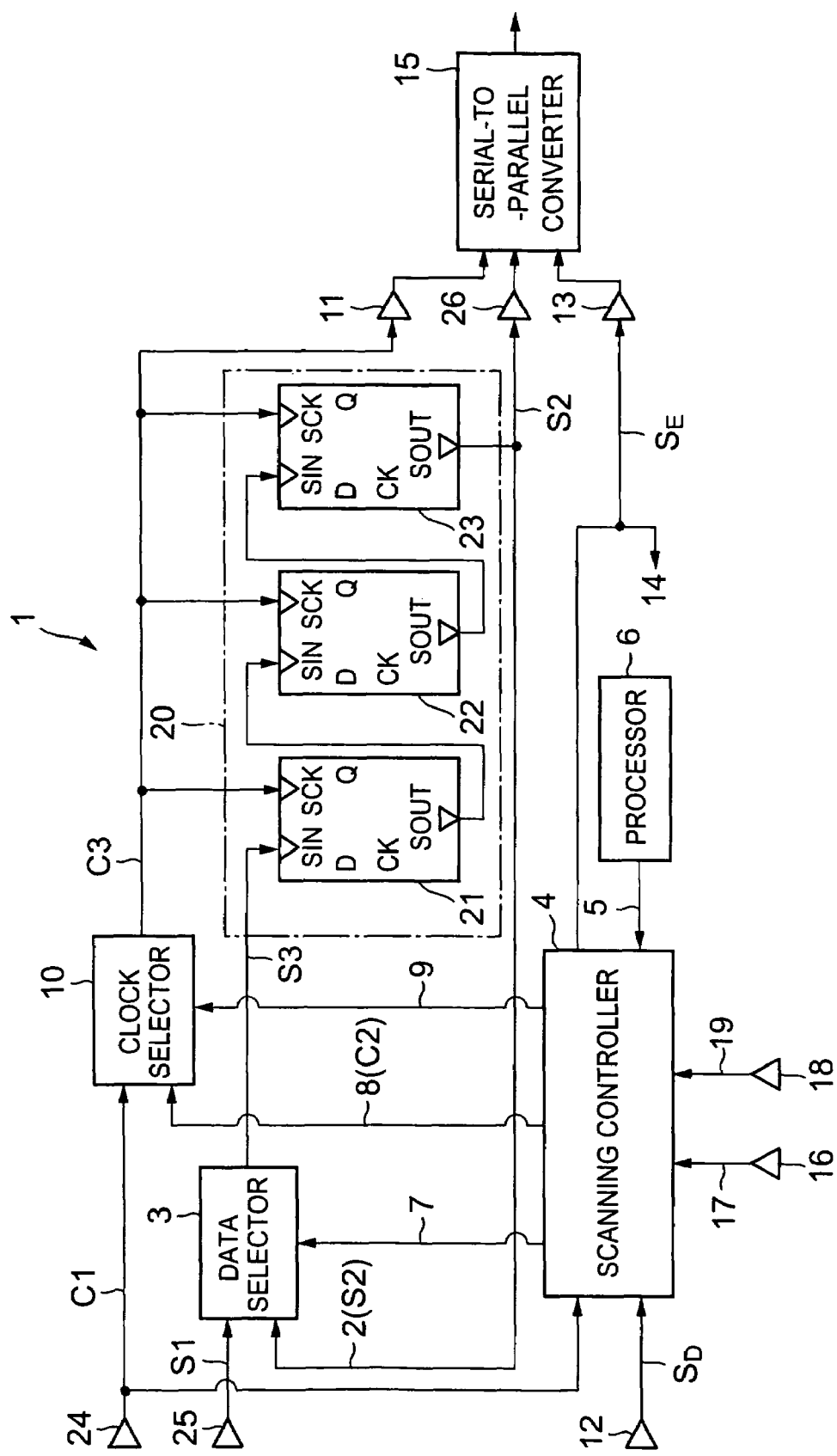
FIG. 4 shows a circuit diagram of a logic circuit as a fourth embodiment according to the present invention.

Disclosed with respect to FIG. 4 is a fourth embodiment of logic circuit having a self-test function allowing external triggering of the internal clock signals at any moment.

Elements, shown in FIG. 4, identical or analogous to those shown in FIGS. 1 to 3 are given the same numerals and not explained in detail for brevity.

Input to the scanning controller 4, in addition to the external scanning clock signal C1, the processor instruction 5 and the disable signal $S_D$, are a rotate signal 17, via an external input terminal 16 to advance a program by one cycle after one sequential operation of the scanning F/F circuits 21 to 23 for another sequential operation and a step signal 19 via an external input terminal 18 to allow data of the scanning F/F circuits 21 to 23 to be output after one-cycle program advancement in response to the rotate signal 17 and then bring the logic circuit 1 in a halt.

The fourth embodiment of logic circuit having a self-test function offers external initiation of internal F/F scanning with the rotate signal 17 at any time, instead of the processor instruction 5.

The rotate signal 17 allows external monitoring of data in the scanning F/F circuits 21 to 23. Continuous supply of the rotate signal 17 allows repetition of the program advancement by one cycle after one sequential operation of the scanning F/F circuits 21 to 23 for another sequential operation.

These functions offer cycle-based F/F-scanning program debugging.

Moreover, the step signal 19 allows data output from the scanning F/F circuits 21 to 23 after one-cycle program advancement while the rotate signal 17 is active and then brings the logic circuit 1 to a halt.

The cycle-based F/F-scanning program debugging in the fourth embodiment uses an external scanning clock signal to operate the scanning F/F circuitry for program debugging, thus allowing users to accurately locate bugs in a program.

The first to fourth embodiments shown in FIGS. 1 to 4, respectively, activate one group of the scanning F/F circuits 21 to 23.

Figure 5:
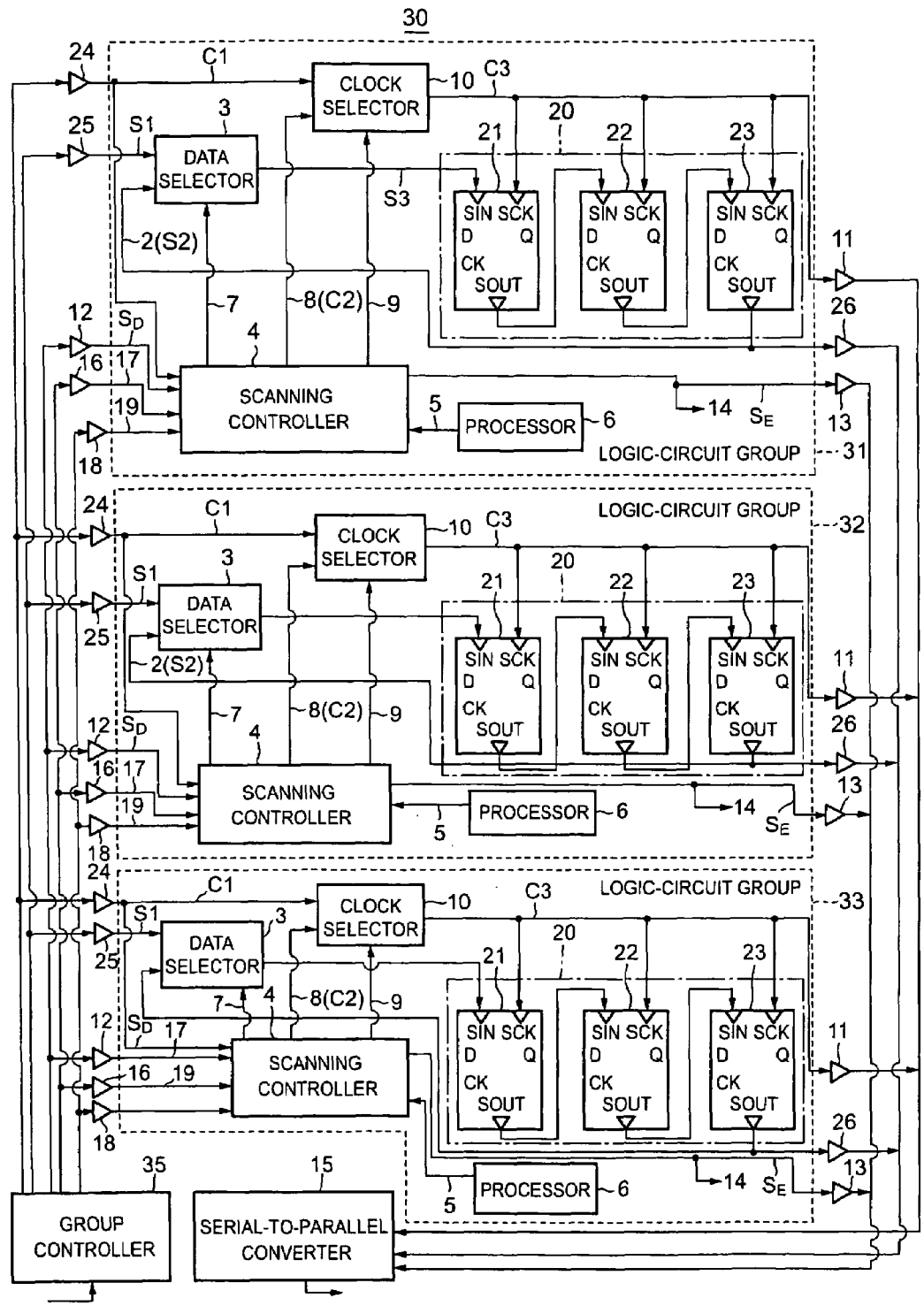
FIG. 5 shows a circuit diagram of a logic circuit as a fifth embodiment according to the present invention.

Not only one group, however, the present invention is applicable to circuit groups 31 to 33 each having scanning F/F circuits 21 to 23, as shown in FIG. 5.

A logic circuit 30 as a fifth embodiment according to the present invention has the circuit groups 31 to 33. Each circuit group is equipped with scanning F/F circuits 21 to 23, a data selector 3, a scanning controller 4 and a clock selector 10.

The circuit group to be subjected to F/F scanning is selected based on a processor instruction 5 installed in each circuit group. The number of F/F-scanning times can be changed in the selected circuit group for efficient program debugging.

The logic circuit 30 is further equipped with a group controller 35 for selective control of one circuit group, or sequential or alternate control among the circuit groups 31 to 33.

The group controller 35 supplies data, clock and control signals to external input terminals 24, 25, 12, 16 and 18 of each circuit group. The controller 35 performs scanning control among the circuit groups 31 to 33 whereas each scanning controller 4 performs scanning control in the corresponding single circuit group.

The logic circuit 30 is further equipped with a serial-to-parallel converter 15 to which the external output terminals 11, 26 and 13 of all circuit groups are connected for serial-to-parallel output conversion at desired rate against a very fast internal scanning clock for all circuit groups.

The serial-to-parallel converter 15 may be provided for each circuit group, like the third and fourth embodiments.

The logic circuit 30 having a self-test function as the fifth embodiment, equipped with the group controller 35, is capable of F/F scanning to any number of the circuit groups 31 to 33 simultaneously or sequentially for program debugging based on processor instructions.

Moreover, like the second to fourth embodiments, the fifth embodiment has the following functions for each circuit group: generation of the internal stall signal 14 to stop all clock signals in the internal circuitry, external F/F scanning in response to the disable signal $S_D$ instead of the processor instruction 5, program advancement by one cycle in response to the rotate signal 17 after one sequential operation of the scanning F/F circuits 21 to 23 for another sequential operation, and data output from the scanning F/F circuits 21 to 23 after one-cycle program advancement and then bringing each circuit group in a halt in response to the rotate signal 17 and the step signal 19 (cycle debugging).

The fifth embodiment shown in FIG. 5 has only three circuit groups 31, 32 and 33 each having three scanning F/F circuits 21, 22 and 23, for brevity. The number of circuit groups and that of scanning F/F circuits in each group are, however, flexible in this invention, such as several ten thousands or several million thousands.

In other words, the present invention offers F/F-scanning program debugging for huge number of circuit groups each having huge number of F/F-circuit stages.

As disclosed above in detail, the logic circuit having a self-test function according to the present invention employs an F/F-scanning function for detection of LSI malfunctions in F/F-scanning tests to the internal logic circuitry or program debugging.

The state of the internal logic circuitry can be output from the logic circuit with minute circuit changes. Thus, the present invention allows monitoring of malfunctions of the internal circuitry or bugs in a program running on the logic circuit.

The self F/F-scanning function is an important function in detecting malfunctions of logic circuits before shipment while rarely used after shipment.

The present invention offers end users this self F/F-scanning function as a self-test function with no adverse increase in scale of circuitry for detection of malfunctions of logic circuits and bugs in programs running on the logic circuits.

What is claimed is:

1. A logic circuit having a self-test function comprising:
a plurality of scanning flip-flop (F/F) circuits having at least a first-stage scanning F/F circuit, a second-stage scanning F/F circuit and a last-stage scanning F/F circuit, each having a clock input terminal, a scanning input terminal and a scanning output terminal, the scanning F/F circuits being connected to one another so that a scanning clock signal is input to the clock input terminal of each scanning F/F circuit and a signal output from the scanning output terminal of the first-stage scanning F/F circuit is supplied to the scanning input terminal of the second-stage scanning F/F circuit for sequential logical operations;
a feed-back signal line through which a signal from the scanning output terminal of the last-stage scanning F/F circuit is fed back;
at least one data selector to select either an external scanning signal or the signal fed back from the last-stage scanning F/F circuit, the selected signal being supplied to the scanning input terminal of the first-stage scanning F/F circuit;
at least one scanning controller to supply a control signal to the data selector so that the signal fed back from the last-stage scanning F/F circuit is supplied to the scanning input terminal of the first-stage F/F scanning circuit, thus controlling each scanning F/F circuit in an internal scanning mode;
an external scanning output terminal via which the signal fed back from the last-stage scanning F/F circuit is output from the logic circuit;
at least one clock selector to select either an external scanning clock signal or an internal scanning clock signal supplied from the scanning controller, the selected scanning clock signal being supplied to the clock input terminal of each scanning F/F circuit;
an external clock output terminal via which the selected scanning clock signal supplied to the clock input terminal of each scanning F/F circuit is output from the logic circuit;
a disable-signal input terminal via which a disable signal for externally activating each scanning F/F circuit is input to the scanning controller to set an external F/F-scanning mode; and
an enable output terminal via which an enable signal is output from the logic circuit, the enable signal indicating that the scanning F/F circuits are active in the sequential logical operations in the external F/F-scanning mode,
wherein the scanning controller supplies the enable signal as an internal stall signal to the scanning F/F circuits when the enable signal is output from the logic circuit via the enable output terminal, the internal stall signal inhibiting the scanning clock signal to be supplied to the scanning F/F circuits.

2. The logic circuit according to claim 1, wherein the scanning controller supplies the control signal to the data selector based on a processor instruction of a pre-stored program.

3. The logic circuit according to claim 1 further comprising a serial-to-parallel converter, connected to the external scanning clock output terminal, the external scanning output terminal and the enable output terminal, to convert serial data output from the external scanning output terminal to parallel data.

4. The logic circuit according to claim 1, wherein, in response to an external rotate signal, the scanning controller advances an installed program by one cycle after one logical sequential logical operation of the scanning F/F circuits for another logical sequential operation, and in response to an external step signal, the scanning controller outputs data of the scanning F/F circuits from the logic circuit after one-cycle program advancement in response to the rotate signal and then brings the logic circuit to a halt.

5. The logic circuit according to claim 2, wherein the processor instruction is a reduced instruction set computer instruction.

6. The logic circuit according to claim 2, wherein the scanning F/F circuits are divided into a plurality of logic-circuit groups each including the data selector, the clock selector and the scanning controller.

* * * * *